United States Patent
Fornero et al.

(10) Patent No.: US 12,423,493 B2
(45) Date of Patent: Sep. 23, 2025

(54) SYNTHETIC LOADING OF CONFIGURABLE LOGIC DEVICES

(71) Applicant: GM CRUISE HOLDINGS LLC, San Francisco, CA (US)

(72) Inventors: Matthew Fornero, Berkeley, CA (US); Manjukumar Harthikote Matha, San Francisco, CA (US); Francis Bruno, Naperville, IL (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 572 days.

(21) Appl. No.: 17/962,272

(22) Filed: Oct. 7, 2022

(65) Prior Publication Data
US 2024/0119207 A1    Apr. 11, 2024

(51) Int. Cl.
G06F 30/343    (2020.01)
G06F 9/445    (2018.01)
G06F 11/267    (2006.01)
G06F 11/27    (2006.01)
G06F 30/331    (2020.01)
G06F 30/347    (2020.01)
(Continued)

(52) U.S. Cl.
CPC .......... G06F 30/343 (2020.01); G06F 9/445 (2013.01); G06F 11/267 (2013.01); G06F 11/27 (2013.01); G06F 30/331 (2020.01); G06F 30/347 (2020.01); G06F 30/367 (2020.01); G06F 30/373 (2020.01); G06F 30/394 (2020.01); G06F 30/398 (2020.01)

(58) Field of Classification Search
CPC .... G06F 30/343; G06F 30/331; G06F 30/347; G06F 30/367; G06F 30/373; G06F 30/394; G06F 30/392; G06F 30/398; G06F 11/267; G06F 11/27; G06F 9/445
USPC ....... 716/117, 121, 128; 703/15; 713/2, 100; 714/725, 732, 733
See application file for complete search history.

(56) References Cited

U.S. PATENT DOCUMENTS 7,812,635 B1 * 10/2010 Hutton ............ H03K 19/17728
                                                    326/38
8,664,975 B1 * 3/2014 Gao ................... G06F 30/34
                                                    326/38
(Continued)

Primary Examiner — Phallaka Kik
(74) Attorney, Agent, or Firm — CANTOR COLBURN LLP

(57) ABSTRACT

Disclosed are systems and methods for synthetic loading of configurable logic devices. In some aspects, a method includes determining computational elements that are available for configuration in a configurable logic hardware device; executing a compilation process to program the available computational elements with a conditionally-enabled configuration and to program one or more load enable trees to enable a load of the conditionally-enabled configuration at the computational elements; configuring a software interface to enable the load of the conditionally-enabled configuration on portions of the computational elements via the one or more load enable trees based on a percentage enablement parameter; and enabling iteration through different percentage enablement parameter values, via the software interface, to cause the load of the conditionally-enabled configuration to be applied to different portions of the computational elements without recompiling the configurable logic hardware device.

20 Claims, 8 Drawing Sheets

(51) Int. Cl.
*G06F 30/367* (2020.01)
*G06F 30/373* (2020.01)
*G06F 30/394* (2020.01)
*G06F 30/398* (2020.01)

(56) References Cited

U.S. PATENT DOCUMENTS

| | | | |
|---|---|---|---|
| 11,275,503 B2* | 3/2022 | Davis | G06F 21/51 |
| 11,886,340 B1* | 1/2024 | Tong | G06F 9/5016 |
| 2018/0081834 A1* | 3/2018 | Wang | G06F 13/4022 |
| 2019/0199692 A1* | 6/2019 | Atta | H04L 9/3247 |
| 2020/0257454 A1* | 8/2020 | Davis | G06F 21/51 |
| 2022/0263770 A1* | 8/2022 | Thyagaturu | H04L 43/0852 |
| 2023/0006674 A1* | 1/2023 | Bhunia | G06F 21/75 |
| 2023/0197030 A1* | 6/2023 | Konduru | G09G 5/02 |
| | | | 345/204 |

* cited by examiner

500

Determine computational elements that available for configuration in a configurable logic hardware device
510

Execute a compilation process to program the available computational elements with a conditionally-enabled configuration and one or more load enable trees to enable a load of the conditionally-enabled configuration at the computational elements
520

Configure a software interface that can be used to enable the load of the conditionally-enabled configuration on portions of the computational elements via the one or more load enable trees based on a percentage enablement parameter
530

Enable iteration through different percentage enablement parameter values, via the software interface, to cause the load of the conditionally-enabled configuration to be applied to different portions of the computational elements without recompiling the configurable logic hardware device
540

Program computational elements of a configurable logic hardware device with configurations to toggle a workload of the computational elements
610

Program load enable trees in the configurable logic hardware device to dynamically enable the configurations of the computational elements
620

Receive a control signal indicating a percentage of the computational elements to enable for loading
630

Interface with the load enable trees to cause a portion of the computational elements to enable the configurations in accordance with the percentage
640

*FIG. 6*

SYNTHETIC LOADING OF CONFIGURABLE LOGIC DEVICES

BACKGROUND

1. Technical Field

The disclosure generally relates to the field of processing systems and, more specifically, to synthetic loading of configurable logic devices.

2. Introduction

Hardware component and system designs, and in particular the software utilizing the hardware components and systems, can evolve over the lifetime of the hardware components and systems. This is especially true for designs associated with autonomous vehicle systems. An autonomous vehicle system is a motorized vehicle that can navigate without a human driver. In such systems, understanding the capability limits of the hardware of the autonomous vehicle in terms of its ability to reliably deliver power to the hardware's computational elements, as well as the ability for the hardware to not overheat in expected operational environments, is part of the design and testing process for the autonomous vehicle system.

BRIEF DESCRIPTION OF THE DRAWINGS

The various advantages and features of the disclosed technology will become apparent by reference to specific implementations illustrated in the appended drawings. A person of ordinary skill in the art will understand that these drawings only show some examples of the disclosed technology and would not limit the scope of the disclosed technology to these examples. Furthermore, the skilled artisan will appreciate the principles of the disclosed technology as described and explained with additional specificity and detail through the use of the accompanying drawings in which:

FIG. 5 illustrates an example method for synthetic loading of configurable logic devices, in accordance with embodiments herein;

FIG. 6 illustrates an example method for programming and enabling synthetic loading of configurable logic devices, in accordance with embodiments herein;

DETAILED DESCRIPTION

Figure 1:
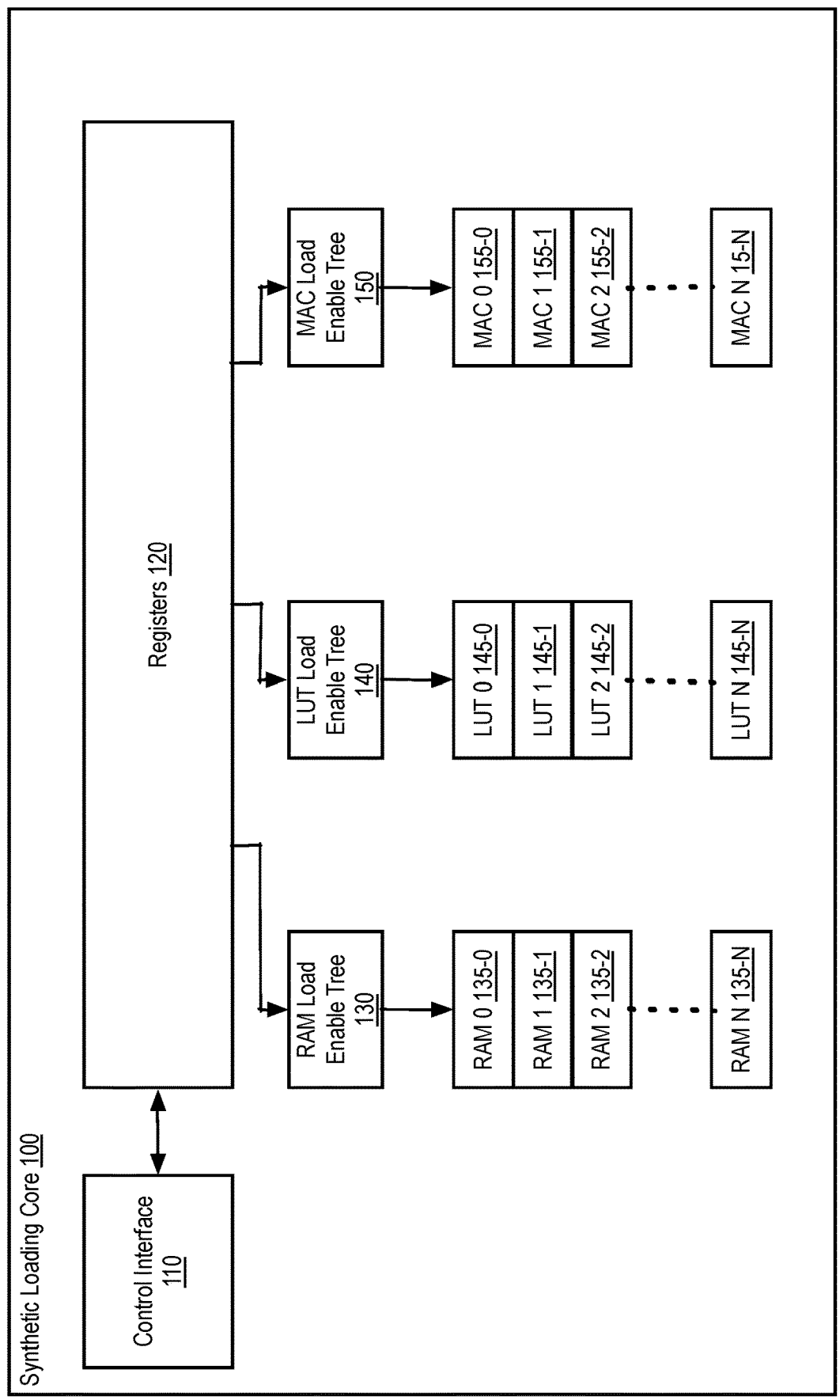
FIG. 1 illustrates a functional block diagram for a synthetic loading core that provides operations for synthetic loading of configurable logic devices, in accordance with an embodiment herein.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

Autonomous vehicles (AVs) can be implemented by companies to provide self-driving car services for the public, such as taxi or ride-haling (e.g., ridesharing) services and delivery services. The AV can navigate about roadways without a human driver based upon sensor signals output by sensor systems deployed on the AV. The AV can utilize various different processing hardware to implement the operations supporting its navigation routine. The different processing hardware can include any general-purpose processor and a hardware service or software service configured to control the processor. Processing hardware can include a special-purpose processor where software instructions are incorporated into the actual processor design. The processor may be a completely self-contained computing system, containing multiple cores or processors, a bus, memory controller, cache, etc. A multi-core processor may be symmetric or asymmetric. In some embodiments, the processor can include one or more of a central processing unit (CPU), a graphics processing unit (GPU), and/or a configurable logic hardware device. The configurable logic hardware device may include combinational and sequential logic circuitry. The configurable logic hardware device may be configured to perform a custom logic function. In one embodiment, the configurable logic hardware device is a field-programmable gate array (FPGA), for example.

As part of the development process of the AV, extensive testing is conducted on the AV and its underlying components, such as the processor(s) of the AV. Such testing can include testing of hardware components and system designs of the AV. For example, testing of the AV can confirm whether the AV components support a specified power delivery, whether the AV components are in compliance with electromagnetic compatibility (EMC) and electromagnetic interference (EMI) standards, and/or whether the cooling system of the AV at the component level and overall vehicle level is able to maintain a temperature within a determined specification. In AV systems, understanding the capability limits of the hardware and components of the AV in terms of ability to reliably deliver power to the AV's computational elements, as well as the ability to not overheat in expected operational environments, is a part of the design and testing process for the AV system.

However, one problem encountered in testing of the AV is that the hardware components and system design of the AV can evolve over the lifetime of the hardware components and systems. For example, some AVs utilize configurable logic devices as part of the design of the autonomous vehicle. Such configurable logic devices can include field programmable gate arrays (FPGAs). When designing FPGAs, there is usually a delay between when the final design is completed and ready to ship and when the board design is completed. Furthermore, there can be "feature creep" over time due to unused resources being consumed to provide additional functionality and/or to fix bugs in the original design.

Approaches may be used for stress testing CPUs and/or GPUs up to the hardware design limits of a system. Such approaches include software techniques that can create artificial work or a "synthetic load" for the CPU/GPU and thus determine if the hardware design is capable of delivering power, maintaining stable operation, and staying within the overall thermal limits of the system. However, these techniques are not applicable to and do not work in the field of FPGAs, as FPGAs are different in structure and programming model from CPUs and GPUs. For example, because FPGA are programmable logic circuits, the software techniques that create the artificial work or "synthetic load" are not transferrable to the FPGA. Instead, the FPGA utilizes a specialized hardware design applicable to the configurable hardware of the FPGA to provide for the artificial work or "synthetic load".

Embodiments herein provide for synthetic loading of configurable logic devices, such as FPGAs. Configurable logic devices may also be referred to herein as configurable logic hardware devices. As previously noted, configurable logic devices can include FPGAs, but may also include other types of configurable logic devices such as, programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), and complex programmable logic devices (CPLDs), just to name a few. As such, system configurations in which a configurable logic device is described as an FPGA are provided as an example and are not intended to limit the scope of the embodiments.

Synthetic loading can refer to mimicking real load data (e.g., providing fake loads) by sending simulated requests (e.g., workloads) to underlying hardware and systems. Synthetic loading can provide a way to identify performance issues before such issues degrade performance of the underlying hardware. Embodiments herein provide synthetic load logic that implements a mechanism for forcing a load into a configurable logic device, such as an FPGA, prior to design completion by using unused resources of the configurable logic device. This can be done before any actual work is started on the algorithms or logic intended to run on the FPGA. Once the design is built with synthetic loading, it is possible to synthetically stress the FPGA-based system, and verify power delivery, system stability, and overall thermal performance. This can provide an early indication of possible hardware faults or design issues, or identify system level limitations providing advance notice for possible redesign situations.

Furthermore, the synthetic load logic provided herein enables fine-grained control of the synthetic loading applied to a configurable logic device. The synthetic load logic implements a load enabling component, such as a binary tree of enable bits, that allows for control of whether a load is sent to a computational sub-element of the configurable logic device (e.g., controls whether the computational component of the configurable logic device is enabled or not). A binary tree may refer to a data structure that can be implemented in the FPGA. As such, the load enabling component allows for control of the number of computational elements in the configurable logic device that are turned on or off. Furthermore, the control can be based upon a percentage of device resources, such that determined portions or subsets of the computational elements can be selectively enabled. This allows for exploration of system level limitations, as well as accurate modeling of the intended computational load on the device.

Further details of the synthetic loading of configurable logic devices of embodiments herein are further described below with respect to FIGS. 1-8. Although embodiments herein are described in the example context of testing of AVs, other use cases for the synthetic loading of configurable logic devices are encompassed by embodiments herein, and are not solely limited to applicability in the field of AVs.

FIG. 1 illustrates a functional block diagram for a synthetic loading core 100 that provides operations for synthetic loading of configurable logic devices, in accordance with an embodiment herein. In one embodiment, synthetic loading core 100 is configured on a configurable logic device, such as an FPGA. In one embodiment, the configurable logic device is implemented in a vehicle (e.g., an autonomous vehicle (AV), which in some embodiments is fully autonomous while in other embodiments is a driver-assisted vehicle, etc.).

Synthetic loading core 100 may refer to one or more IP cores that implement a mechanism for forcing a load into a configurable logic device, such as an FPGA, prior to design completion by using unused resources of the configurable logic device. One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP" or "IP cores," are reusable units of logic for an integrated circuit that may be stored on a tangible, machine-readable medium as a hardware model that describes the structure of the integrated circuit. Synthetic loading core 100 may include such reusable units of logic for a configurable logic device, such as an FPGA, that may be stored as a hardware model that describes the structure of the configurable logic device (FPGA). Although shown and described as a single core, synthetic loading core 100 may be comprised of multiple IP cores for implementing the framework described herein. For example, synthetic loading core 100 may include a control IP core including the control interface 110 and registers 120 and one or more synthetic load IP cores including the load enable trees 130, 140, 150 and configured computational elements 135, 145, 155.

For ease of explanation the following description may refer to a configurable logic device as an FPGA, however this is provided as an example and is not intended to limit the scope of the embodiments.

As previously noted, synthetic loading can refer to mimicking real load data (e.g., providing fake loads) by sending simulated requests (e.g., workloads) to underlying hardware and systems. Synthetic loading can provide a way to identify performance issues before such issues degrade performance of the underlying hardware. Synthetic loading core 100 may represent reusable units of logic that can be configured (e.g., compiled) on the FPGA as a hardware model that describes the structure of the synthetic loading logic to implement on the FPGA.

As illustrated in FIG. 1, synthetic loading core 100 can include components providing a framework for extending the concept of percentage loading to the computational elements of the FPGA. The computational elements of the FPGA can include, but are not limited to, one or more random access memory (RAM) elements 135-0, 135-1, 135-2, . . . , 135-N (may be collectively referred to herein as RAM 135 or RAM elements 135), one or more look-up table (LUT) elements 145-0, 145-1, 145-2, . . . , 145-N (may be collectively referred to herein as LUT 145 or LUT elements 145), and/or one or more multiply-accumulate (MAC) elements 155-0, 155-1, 155-2, . . . , 155-N (may be collectively referred to herein as MAC 155 or MAC elements 155). More or less computational elements than depicted and described herein may be implemented on the configurable logic device (e.g., FPGA), and utilized by synthetic loading core 100 in embodiments herein.

RAM elements 135 may refer to embedded static RAM (SRAM) elements, such as block RAM (BRAM) and/or Ultra RAM (URAM), for example. RAM elements 135 are computational elements used to load and store data for the FPGA. LUT elements 145 are computational elements that implement combinatorial logic for the FPGA. The LUT element 145 provides a lookup table that is directly addressable to provide an output value. The LUT element 145 in an FPGA can be implemented with multiplexer(s) whose select lines are driven by an address signal and whose inputs are the value of the elements in an array. An n-bit LUT element 145 can encode any n-input Boolean function by storing a truth table of the function in the LUT element 145. MAC elements 155 are embedded multiply accumulate engines that perform a multiply accumulate operation on their inputs. In some embodiments, MAC elements 155 may also be known as digital signal processing (DSP) engines in the context of FPGAs.

Synthetic loading core 100 can further include a control interface 110 and one or more registers 120. The combination of the control interface 110 and registers 120 provides a control plane for the synthetic loading core 100 that allows for a controlling entity (e.g., CPU software, GPU software, etc.) to interface between the synthetic loading core 100. The control interface 110 can be, for example, a serial port capable of communication with a universal serial bus (USB) of a communicably coupled system (e.g., a CPU).

In embodiments herein, the synthetic loading core 100 is programmed on the configurable logic device, such as an FPGA, to enable controllable loading of the available computational elements on the configurable logic device. In one embodiment, computational elements that are considered "available" for configuration may refer to those computational elements that are not yet programmed or configured on the configurable logic device. Embodiments may identify available computational elements manually or automatically. For example, a manual query of the FPGA may return the available resources (computational elements) of the FPGA. In some embodiments, a datasheet of the configurable logic device may be referenced to determine available computational elements. In some embodiments, a compiler may automatically provide information on the available computational elements of the configurable logic device.

Figure 2:
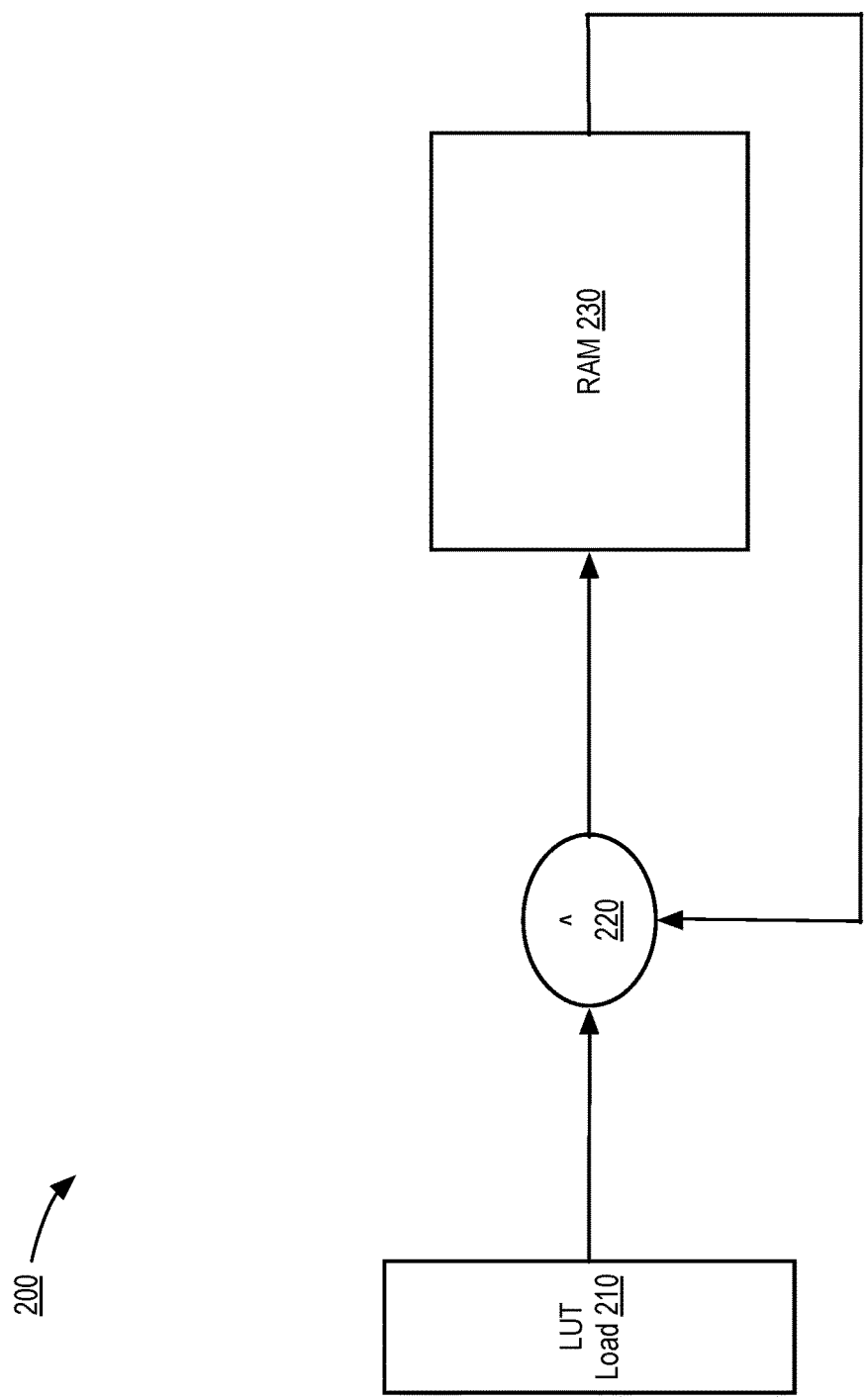
FIG. 2 illustrates a functional block diagram for a random access memory (RAM) element having a toggling configuration for synthetic loading of configurable logic devices, in accordance with an embodiment herein.
Figure 3:
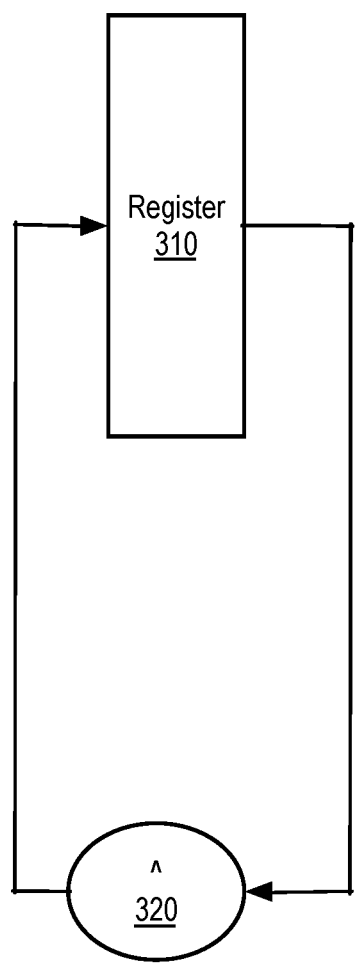
FIG. 3 illustrates a functional block diagram for a look-up table (LUT) element having a toggling configuration for synthetic loading of configurable logic devices, in accordance with an embodiment herein.
Figure 4:
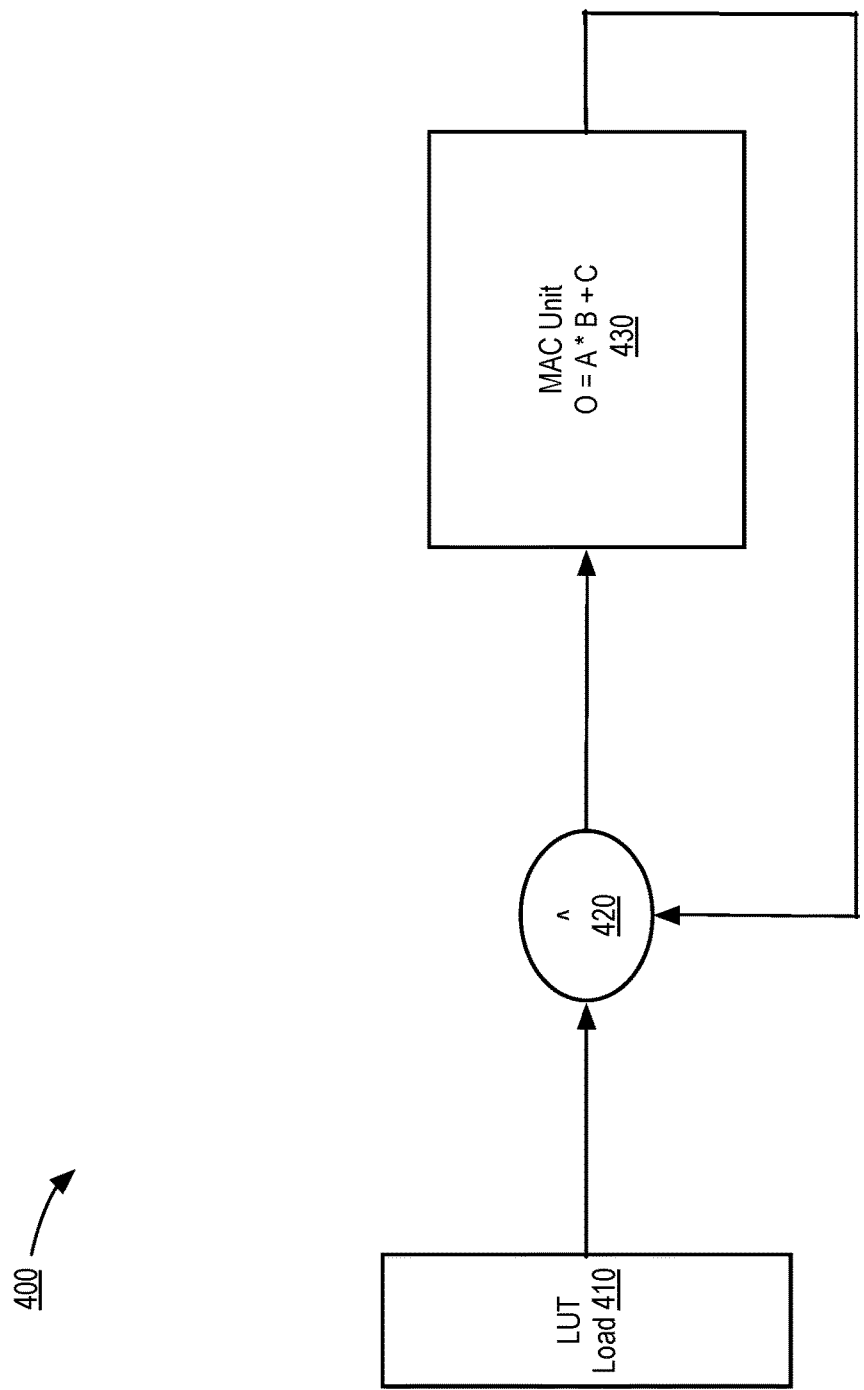
FIG. 4 illustrates a functional block diagram for a multiply-accumulate (MAC) element having a toggling configuration for synthetic loading of configurable logic devices, in accordance with an embodiment herein.

As part of programming the synthetic loading core 100 on the FPGA, the computational elements 135, 145, 155 are configured to implement self-perpetuating (or toggling) logic to generate, when enabled, as near to 100% utilization of the computational elements 135, 145, 155 as possible. The toggling logic configured on the computational elements 135, 145, 155 may perform an operation that does not utilize any sort of external stimulus to generate transitions in the underlying elements of the computational elements. In other words, the toggling logic configured on the computational elements 135, 145, 155 can create a self-sustaining pattern that has a high toggle (i.e., transition) rate for the underlying computational element 135, 145, 155. FIGS. 2-4 provide example use cases for implementing toggling logic (also referred to as toggling operations or toggling configurations herein) in computational elements 135, 145, 155. Other example configurations may also be implemented in embodiments herein and embodiments are not limited to the examples described in FIGS. 2-4. In embodiments herein, toggling logic may also be referred to as conditionally-enabled logic or a conditionally-enabled configuration, for example.

FIG. 2 illustrates a functional block diagram for a RAM element 200 having a toggling configuration for synthetic loading of configurable logic devices, in accordance with an embodiment herein. In one embodiment, RAM element 200 is the same as RAM element 135 described with respect to FIG. 1. As illustrated, RAM element 200 is configured to implement a toggling operation that generates transitions in the underlying elements of the RAM element 200 to obtain close to full utilization of the RAM element 200. In the example shown in FIG. 2, RAM loads utilize a LUT load 210 (e.g., LUT 145 of FIG. 1) to provide a source which is exclusive or-ed (XOR'd) using an XOR component 220 (e.g., XOR gate) with data from a RAM 230, which is written back into the RAM 230. This causes simultaneous reads and writes, as well as 100% utilization of the RAM.

FIG. 3 illustrates a functional block diagram for a LUT element 300 having a toggling configuration for synthetic loading of configurable logic devices, in accordance with an embodiment herein. In one embodiment, LUT element 300 is the same as LUT element 145 described with respect to FIG. 1. As illustrated, LUT element 300 is configured to implement a toggling operation that generates transitions in the underlying elements of the LUT element 300 to obtain close to full utilization of the LUT element. In the example shown in FIG. 3, the loading to exercise the toggling operation of LUT element 300 includes a register 310 (e.g., a 64-bit register, such as register 120 of FIG. 1) that feeds back upon itself using XOR component 320 (e.g., XOR gate, inverter component, inverter) to invert the data every cycle. This can create 100% utilization of the LUT element 300.

FIG. 4 illustrates a functional block diagram for a MAC element 400 having a toggling configuration for synthetic loading of configurable logic devices, in accordance with an embodiment herein. In one embodiment, MAC element 400 is the same as MAC element 155 described with respect to FIG. 1. As illustrated, MAC element 400 is configured to implement a toggling operation that generates transitions in the underlying elements of the MAC element 400 to obtain close to full utilization of the MAC element. In the example shown in FIG. 4, the loading to exercise the toggling operation of MAC element 400 utilizes a LUT load 410 (e.g., LUT 145 of FIG. 1) that feeds into a MAC unit block 430 that splits out the inputs to perform a MAC operation (e.g., A*B+C). The output of the MAC unit block 430 is pipelined via an XOR component 420 to enable maximal usage and toggling of the MAC element 400.

Referring back to FIG. 1, the synthetic loading core 100 can provide for fine-grained control of the synthetic loading applied to the computational elements 135, 145, 155 in embodiments herein. The synthetic loading core 100 can provide one or more load enablement components, such as load enable trees 130, 140, 150, that allow for control of whether a load is sent to a computational element of the configurable logic device (e.g., controls whether the computational component of the configurable logic device is enabled or not). As such, the load enable trees 130, 140, 150 allow for control of the number of computational elements 135, 145, 155 in the FPGA that are turned on or off. In embodiments herein, a load enable tree 130, 140, 150 may be provided for each type of computational element. For example, a RAM load enable tree 130 is configured for the RAM elements 135, a LUT load enable tree 140 is configured for the LUT element 145, and a MAC load enable tree is configured for the MAC elements 155.

In one embodiment, the load enable trees 130, 140, 150 can be implemented as a binary tree of enable bits. In one example, there may be four (4) bits in a binary tree, where each bit controls four different synthetic calculations that run on the corresponding computational element 135, 145, 155. With four bits in the binary tree, the computational elements are divided into four subsets or groups (also referred to as portions herein), such as RAM 0, RAM 1, RAM 2, and RAM 3 in the case of the RAM elements 135. As such, the number of enable bits in a binary tree directly corresponds to the number of groups that each type of computational element 135, 145, 155 is split into. As shown in FIG. 1, when a load enable tree 130 is configured with four bits, the value of N (e.g., RAM N 135-N, LUT N 145-N, and MAC N 155-N) is four.

As a result of utilizing a load enable tree 130, 140, 150 in the configuration of synthetic loading core 100, control of loading operations to the computational elements 135, 145, 155 can be based upon a percentage of device resources, such that a predetermined portions or subsets of the computational elements can be selectively enabled. This allows for determining possible device limitations and/or reducing the stress on the device, which in turn allows for more accurately modeling actual device usage.

With "n" bits configured in the load enable trees 130, 140, 150, embodiments can achieve $1/(2^n-1)$ programmability of the amount of load in the synthetic loading core 100. For example, with four control bits configured in the load enable tree 130, 140, 150, control up to a 25% granularity can be obtained. If a fifth bit is added, embodiments can obtain control to a 12.5% granularity, and so on.

In embodiments herein, the control interface 110 can interface with the load enable trees 130, 140, 150 to provide for the percentage scalable loading described herein. A percentage enable parameter may be utilized by software or hardware interfacing with the synthetic loading core 100, via control interface 110, to allow for control of the granularity of loading of the computational elements 135, 145, 155. The percentage enable parameter can map to the bits of the load enable trees 130, 140, 150 to allow for stepping of load levels. For a four-bit load enable tree 130, 140, 150, sixteen (16) steps of loading can be provided, where zero (0) is all off and sixteen (16) is all on. This corresponds to a 6.25% stepping. Software code interfacing with the control interface 110 can then be modified (via the percentage enable parameter) to obtain more or less loading of the computational elements 135, 145, 155. Furthermore, the configuration of the load enable trees 130, 140, 150 can also be modified to allow for more or less bits to enable more or less granularity of loading.

In some embodiments, the control interface 110 can also provide for a loading enable parameter that enables or disables the loading of the synthetic loading core 100. The loading enable parameter may be utilized by software or hardware interfacing with the synthetic loading core 100, via control interface 110, to allow for turning on and off the synthetic loading feature provided by synthetic loading core 100.

The control of loading operations provided by the synthetic loading core 100 in embodiments herein allows for achieving controllable percentage scaling without having to re-compile the design of the synthetic loading core 100. This allows for quickly modifying the percentage load of the configurable logic device to test different load configurations without having to re-compile the synthetic loading core 100 design each time a load percentage change is requested.

An implementation of the synthetic loading core may identify, for a given configurable logic device, how many computational elements 135, 145, 155 are available for configuration on the device. The configurable logic device is then configured (e.g., compiled) to program the synthetic loading core 100 onto the configurable logic device. This programming includes generating a toggling configuration on each of the computational elements 135, 145, 155, where the toggling configuration causes a high toggle (transition) rate for the underlying computational element (such as described with respect to FIGS. 2-4). In addition, the programming includes configuring a load enable tree 130, 140, 150 for each type of computational element 135, 145, 155. Once programming is complete, the synthetic loading core 100 can be utilized to dynamically (e.g., at runtime) load (enable) none, all, or a portion of the computational elements 135, 145, 155 in order to generate the toggling workload at those computational elements 135, 145, 155 in accordance with a percentage enable parameter provided to the synthetic loading core 100. The load enable trees 130, 140, 150 are utilized to enable the percentage enable parameter at the computational elements 135, 145, 155.

FIG. 5 illustrates an example method 500 for synthetic loading of configurable logic devices, in accordance with embodiments herein. Although the example method 500 depicts a particular sequence of operations, the sequence may be altered without departing from the scope of the disclosure. For example, some of the operations depicted may be performed in parallel or in a different sequence that does not materially affect the function of the method 500. In other examples, different components of an example device or system that implements the method 500 may perform functions at substantially the same time or in a specific sequence.

According to some embodiments, the method 500 includes block 510 where computational elements are determined that are available for configuration in a configurable logic hardware device. In one embodiment, the computational elements can include RAM elements, LUT elements, and/or MAC elements of an FPGA. In one embodiment, the configurable logic device can be queried to identify the computational elements that are available. In one embodiment, a compiler may provide information on the available computational elements.

At block 520, a compilation process is executed to program the available computational elements with a conditionally-enabled configuration. In some embodiments, the conditionally-enabled configuration is the same as the toggling configuration discussed herein. The compilation process is further to program one or more load enable trees to enable a load of the conditionally-enabled configuration at the computational elements. In one embodiment, the load of the conditionally-enabled configuration can cause a high transition rate to occur on the underlying computational element. In one embodiment, the load enable tree is a binary tree of enable bits.

Subsequently, at block 530, a software interface is configured, where the software interface can be used to enable the load of the conditionally-enabled configuration on portions of the computational elements via the one or more load enable trees. In one embodiment, the portion of the computational elements on which to enable the load of the conditionally-enabled configuration is based on a percentage enablement parameter. In one embodiment, the percentage enablement parameters can be stepped in accordance with a number of bits configured in the load enable tree. Lastly, at block 540, iteration through different percentage enablement parameter values is enabled, via the software interface, to cause the load of the conditionally-enabled configuration to be applied to different portions of the computational elements without recompiling the configurable logic hardware device.

FIG. 6 illustrates an example method 600 for programming and enabling synthetic loading of configurable logic devices, in accordance with embodiments herein. Although the example method 600 depicts a particular sequence of operations, the sequence may be altered without departing from the scope of the disclosure. For example, some of the operations depicted may be performed in parallel or in a different sequence that does not materially affect the function of the method 600. In other examples, different components of an example device or system that implements the method 600 may perform functions at substantially the same time or in a specific sequence.

According to some embodiments, the method 600 includes block 610 computational elements of a configurable logic hardware device are programmed with configurations to toggle a workload of the computational elements. In one embodiment, the computational elements can include RAM elements, LUT elements, and/or MAC elements of an FPGA. In one embodiment, the configurable logic device can be queried to identify the computational elements that are available. In one embodiment, a compiler may provide information on the available computational elements. In some embodiments, the configurations are referred to as conditionally-enabled configurations or toggling configurations, for example.

Then, at block 620, load enable trees are programmed in the configurable logic hardware device to dynamically enable the configurations of the computational elements. In one embodiment, the configurations can cause a high transition rate to occur on the underlying computational element. In one embodiment, the load enable tree is a binary tree of enable bits.

At block 630, a control signal is received indicating a percentage of the computational elements to enable for loading. A control interface implemented on the configurable logic device can interface with the load enable trees to provide for the percentage scalable loading described herein. A percentage enable parameter may be utilized by software or hardware to allow for control of the granularity of loading of the computational elements.

Lastly, at block 640, the load enable trees are interfaced with to cause a portion of the computational elements to enable the configurations in accordance with the percentage. In one embodiment, the percentage enable parameter can map to the bits of the load enable trees to allow for stepping of load levels.

Figure 7:
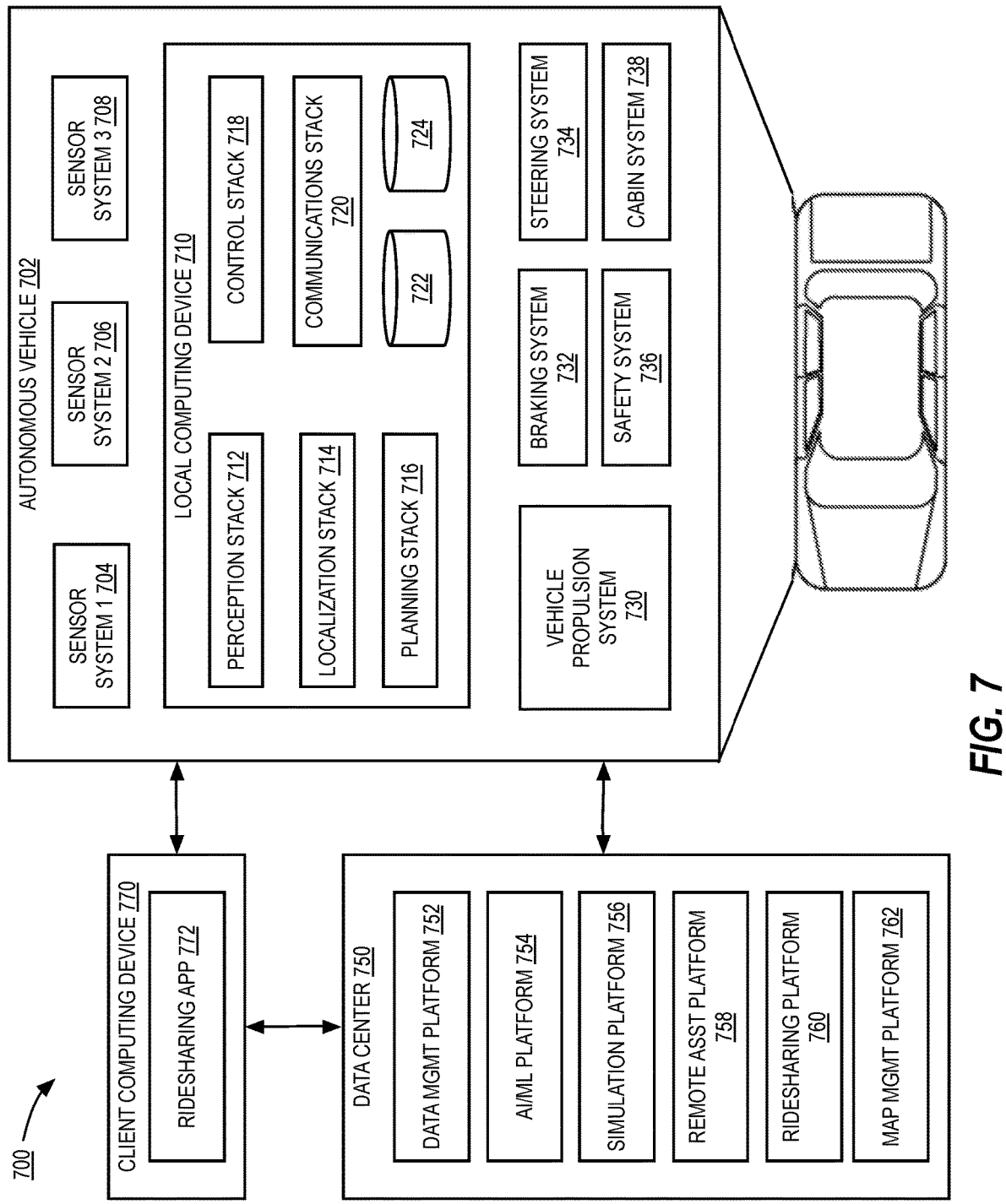
FIG. 7 illustrates an example system environment that can be used to facilitate autonomous vehicle (AV) dispatch and operations, according to some aspects of the disclosed technology.

Turning now to FIG. 7, this figure illustrates an example of an AV management system 700. In one embodiment, the AV management system 700 can implement a sensor synchronization system to precisely synchronizing sensors of different modalities to a common time base, as described further herein. One of ordinary skill in the art will understand that, for the AV management system 700 and any system discussed in the disclosure, there can be additional or fewer components in similar or alternative configurations. The illustrations and examples provided in the disclosure are for conciseness and clarity. Other embodiments may include different numbers and/or types of elements, but one of ordinary skill the art will appreciate that such variations do not depart from the scope of the disclosure.

In this example, the AV management system 700 includes an AV 702, a data center 750, and a client computing device 770. The AV 702, the data center 750, and the client computing device 770 can communicate with one another over one or more networks (not shown), such as a public network (e.g., the Internet, an Infrastructure as a Service (IaaS) network, a Platform as a Service (PaaS) network, a Software as a Service (SaaS) network, another Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

AV 702 can navigate about roadways without a human driver based on sensor signals generated by multiple sensor systems 704, 706, and 708. The sensor systems 704-708 can include different types of sensors and can be arranged about the AV 702. For instance, the sensor systems 704-708 can comprise Inertial Measurement Units (IMUs), cameras (e.g., still image cameras, video cameras, etc.), light sensors (e.g., LIDAR systems, ambient light sensors, infrared sensors, etc.), RADAR systems, a Global Navigation Satellite System (GNSS) receiver, (e.g., Global Positioning System (GPS) receivers), audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 704 can be a camera system, the sensor system 706 can be a LIDAR system, and the sensor system 708 can be a RADAR system. Other embodiments may include any other number and type of sensors.

AV 702 can also include several mechanical systems that can be used to maneuver or operate AV 702. For instance, the mechanical systems can include vehicle propulsion system 730, braking system 732, steering system 734, safety system 736, and cabin system 738, among other systems. Vehicle propulsion system 730 can include an electric motor, an internal combustion engine, or both. The braking system 732 can include an engine brake, a wheel braking system (e.g., a disc braking system that utilizes brake pads), hydraulics, actuators, and/or any other suitable componentry configured to assist in decelerating AV 702. The steering system 734 can include suitable componentry configured to control the direction of movement of the AV 702 during navigation. Safety system 736 can include lights and signal indicators, a parking brake, airbags, and so forth. The cabin system 738 can include cabin temperature control systems, in-cabin entertainment systems, and so forth. In some embodiments, the AV 702 may not include human driver actuators (e.g., steering wheel, handbrake, foot brake pedal, foot accelerator pedal, turn signal lever, window wipers, etc.) for controlling the AV 702. Instead, the cabin system 738 can include one or more client interfaces (e.g., Graphical User Interfaces (GUIs), Voice User Interfaces (VUIs), etc.) for controlling certain aspects of the mechanical systems 730-738.

AV 702 can additionally include a local computing device 710 that is in communication with the sensor systems 704-708, the mechanical systems 730-738, the data center 750, and the client computing device 770, among other systems. The local computing device 710 can include one or more processors and memory, including instructions that can be executed by the one or more processors. The instructions can make up one or more software stacks or components responsible for controlling the AV 702; communicating with the data center 750, the client computing device 770, and other systems; receiving inputs from riders, passengers, and other entities within the AV's environment; logging metrics collected by the sensor systems 704-708; and so forth. In this example, the local computing device 710 includes a perception stack 712, a mapping and localization stack 714, a planning stack 716, a control stack 718, a communications stack 720, a High Definition (HD) geospatial database 722, and an AV operational database 724, among other stacks and systems.

Perception stack 712 can enable the AV 702 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 704-708, the mapping and localization stack 714, the HD geospatial database 722, other components of the AV, and other data sources (e.g., the data center 750, the client computing device 770, third-party data sources, etc.). The perception stack 712 can detect and classify objects and determine their current and predicted locations, speeds, directions, and the like. In addition, the perception stack 712 can determine the free space around the AV 702 (e.g., to maintain a safe distance from other objects, change lanes, park the AV, etc.). The perception stack 712 can also identify environmental uncertainties, such as where to look for moving objects, flag areas that may be obscured or blocked from view, and so forth.

Mapping and localization stack 714 can determine the AV's position and orientation (pose) using different methods from multiple systems (e.g., GPS, IMUs, cameras, LIDAR, RADAR, ultrasonic sensors, the HD geospatial database 722, etc.). For example, in some embodiments, the AV 702 can compare sensor data captured in real-time by the sensor systems 704-708 to data in the HD geospatial database 722 to determine its precise (e.g., accurate to the order of a few centimeters or less) position and orientation. The AV 702 can focus its search based on sensor data from one or more first sensor systems (e.g., GPS) by matching sensor data from one or more second sensor systems (e.g., LIDAR). If the mapping and localization information from one system is unavailable, the AV 702 can use mapping and localization information from a redundant system and/or from remote data sources.

The planning stack 716 can determine how to maneuver or operate the AV 702 safely and efficiently in its environment. For example, the planning stack 716 can receive the location, speed, and direction of the AV 702, geospatial data, data regarding objects sharing the road with the AV 702 (e.g., pedestrians, bicycles, vehicles, ambulances, buses, cable cars, trains, traffic lights, lanes, road markings, etc.) or certain events occurring during a trip (e.g., an Emergency Vehicle (EMV) blaring a siren, intersections, occluded areas, street closures for construction or street repairs, Double-Parked Vehicles (DPVs), etc.), traffic rules and other safety standards or practices for the road, user input, and other relevant data for directing the AV 702 from one point to another. The planning stack 716 can determine multiple sets of one or more mechanical operations that the AV 702 can perform (e.g., go straight at a specified speed or rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the one to meet changing road conditions and events. If something unexpected happens, the planning stack 716 can select from multiple backup plans to carry out. For example, while preparing to change lanes to turn right at an intersection, another vehicle may aggressively cut into the destination lane, making the lane change unsafe. The planning stack 716 could have already determined an alternative plan for such an event, and upon its occurrence, help to direct the AV 702 to go around the block instead of blocking a current lane while waiting for an opening to change lanes.

The control stack 718 can manage the operation of the vehicle propulsion system 730, the braking system 732, the steering system 734, the safety system 736, and the cabin system 738. The control stack 718 can receive sensor signals from the sensor systems 704-708 as well as communicate with other stacks or components of the local computing device 710 or a remote system (e.g., the data center 750) to effectuate operation of the AV 702. For example, the control stack 718 can implement the final path or actions from the multiple paths or actions provided by the planning stack 716. This can involve turning the routes and decisions from the planning stack 716 into commands for the actuators that control the AV's steering, throttle, brake, and drive unit.

The communication stack 720 can transmit and receive signals between the various stacks and other components of the AV 702 and between the AV 702, the data center 750, the client computing device 770, and other remote systems. The communication stack 720 can enable the local computing device 710 to exchange information remotely over a network, such as through an antenna array or interface that can provide a metropolitan WIFI® network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 720 can also facilitate local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 722 can store HD maps and related data of the streets upon which the AV 702 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane or road centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines, and/or boundaries, etc.) and related attributes (e.g., permissive, protected/permissive, or protected only left turn lanes; permissive, protected/permissive, or protected only U-turn lanes; permissive or protected only right turn lanes; etc.). The traffic controls layer can include geospatial information of traffic signal lights, traffic signs, and other road objects and related attributes.

The AV operational database 724 can store raw AV data generated by the sensor systems 704-708 and other components of the AV 702 and/or data received by the AV 702 from remote systems (e.g., the data center 750, the client computing device 770, etc.). In some embodiments, the raw AV data can include HD LIDAR point cloud data, image or video data, RADAR data, GPS data, and other sensor data that the data center 750 can use for creating or updating AV geospatial data.

The data center 750 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 750 can include one or more computing devices remote to the local computing device 710 for managing a fleet of AVs and AV-related services. For example, in addition to managing the AV 702, the data center 750 may also support a ridesharing service, a delivery service, a remote/roadside assistance service, street services (e.g., street mapping, street patrol, street cleaning, street metering, parking reservation, etc.), and the like.

The data center 750 can send and receive various signals to and from the AV 702 and the client computing device 770. These signals can include sensor data captured by the sensor systems 704-708, roadside assistance requests, software updates, ridesharing pick-up and drop-off instructions, and so forth. In this example, the data center 750 includes one or more of a data management platform 752, an Artificial Intelligence/Machine Learning (AI/ML) platform 754, a simulation platform 756, a remote assistance platform 758, a ridesharing platform 760, and a map management platform 762, among other systems.

Data management platform 752 can be a "big data" system capable of receiving and transmitting data at high speeds (e.g., near real-time or real-time), processing a large variety of data, and storing large volumes of data (e.g., terabytes, petabytes, or more of data). The varieties of data can include data having different structures (e.g., structured, semi-structured, unstructured, etc.), data of different types (e.g., sensor data, mechanical system data, ridesharing service data, map data, audio data, video data, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 750 can access data stored by the data management platform 752 to provide their respective services.

The AI/ML platform 754 can provide the infrastructure for training and evaluating machine learning algorithms for operating the AV 702, the simulation platform 756, the remote assistance platform 758, the ridesharing platform 760, the map management platform 762, and other platforms and systems. Using the AI/ML platform 754, data scientists can prepare data sets from the data management platform 752; select, design, and train machine learning models; evaluate, refine, and deploy the models; maintain, monitor, and retrain the models; and so on.

The simulation platform 756 can enable testing and validation of the algorithms, machine learning models, neural networks, and other development efforts for the AV 702, the remote assistance platform 758, the ridesharing platform 760, the map management platform 762, and other platforms and systems. The simulation platform 756 can replicate a variety of driving environments and/or reproduce real-world scenarios from data captured by the AV 702, including rendering geospatial information and road infrastructure (e.g., streets, lanes, crosswalks, traffic lights, stop signs, etc.) obtained from the map management platform 762; modeling the behavior of other vehicles, bicycles, pedestrians, and other dynamic elements; simulating inclement weather conditions, different traffic scenarios; and so on.

The remote assistance platform 758 can generate and transmit instructions regarding the operation of the AV 702. For example, in response to an output of the AI/ML platform 754 or other system of the data center 750, the remote assistance platform 758 can prepare instructions for one or more stacks or other components of the AV 702.

The ridesharing platform 760 can interact with a customer of a ridesharing service via a ridesharing application 772 executing on the client computing device 770. The client computing device 770 can be any type of computing system, including a server, desktop computer, laptop, tablet, smartphone, smart wearable device (e.g., smart watch; smart eyeglasses or other Head-Mounted Display (HMD); smart ear pods or other smart in-ear, on-ear, or over-ear device; etc.), gaming system, or other general purpose computing device for accessing the ridesharing application 772. The client computing device 770 can be a customer's mobile computing device or a computing device integrated with the AV 702 (e.g., the local computing device 710). The ridesharing platform 760 can receive requests to be picked up or dropped off from the ridesharing application 772 and dispatch the AV 702 for the trip.

Map management platform 762 can provide a set of tools for the manipulation and management of geographic and spatial (geospatial) and related attribute data. The data management platform 752 can receive LIDAR point cloud data, image data (e.g., still image, video, etc.), RADAR data, GPS data, and other sensor data (e.g., raw data) from one or more AVs 702, Unmanned Aerial Vehicles (UAVs), satellites, third-party mapping services, and other sources of geospatially referenced data. The raw data can be processed, and map management platform 762 can render base representations (e.g., tiles (2D), bounding volumes (3D), etc.) of the AV geospatial data to enable users to view, query, label, edit, and otherwise interact with the data. Map management platform 762 can manage workflows and tasks for operating on the AV geospatial data. Map management platform 762 can control access to the AV geospatial data, including granting or limiting access to the AV geospatial data based on user-based, role-based, group-based, task-based, and other attribute-based access control mechanisms. Map management platform 762 can provide version control for the AV geospatial data, such as to track specific changes that (human or machine) map editors have made to the data and to revert changes when necessary. Map management platform 762 can administer release management of the AV geospatial data, including distributing suitable iterations of the data to different users, computing devices, AVs, and other consumers of HD maps. Map management platform 762 can provide analytics regarding the AV geospatial data and related data, such as to generate insights relating to the throughput and quality of mapping tasks.

In some embodiments, the map viewing services of map management platform 762 can be modularized and deployed as part of one or more of the platforms and systems of the data center 750. For example, the AI/ML platform 754 may incorporate the map viewing services for visualizing the effectiveness of various object detection or object classification models, the simulation platform 756 may incorporate the map viewing services for recreating and visualizing certain driving scenarios, the remote assistance platform 758 may incorporate the map viewing services for replaying traffic incidents to facilitate and coordinate aid, the ridesharing platform 760 may incorporate the map viewing services into the client application 772 to enable passengers to view the AV 702 in transit en route to a pick-up or drop-off location, and so on.

Figure 8:
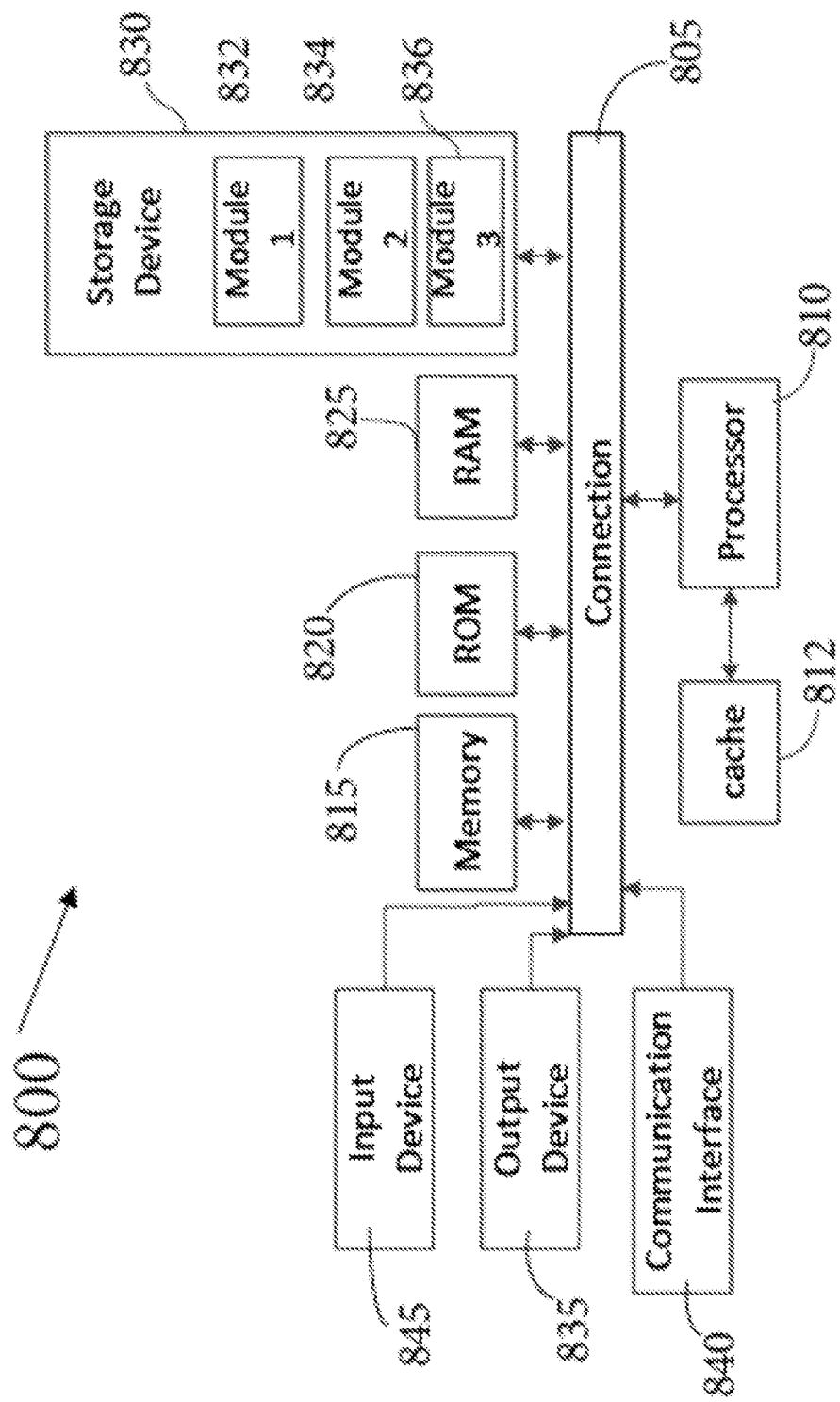
FIG. 8 illustrates an example processor-based system with which some aspects of the subject technology can be implemented.

FIG. 8 illustrates an example processor-based system with which some aspects of the subject technology can be implemented. For example, processor-based system 800 can be any computing device making up, or any component thereof in which the components of the system are in communication with each other using connection 805. Connection 805 can be a physical connection via a bus, or a direct connection into processor 810, such as in a chipset architecture. Connection 805 can also be a virtual connection, networked connection, or logical connection.

In some embodiments, computing system 800 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 800 includes at least one processing unit (Central Processing Unit (CPU) or processor) 810 and connection 805 that couples various system components including system memory 815, such as Read-Only Memory (ROM) 820 and Random-Access Memory (RAM) 825 to processor 810. Computing system 800 can include a cache of high-speed memory 812 connected directly with, in close proximity to, or integrated as part of processor 810.

Processor 810 can include any general-purpose processor and a hardware service or software service, such as services 832, 834, and 836 stored in storage device 830, configured to control processor 810 as well as a special-purpose processor where software instructions are incorporated into the actual processor design. Processor 810 may be a completely self-contained computing system, containing multiple cores or processors, a bus, memory controller, cache, etc. A multi-core processor may be symmetric or asymmetric.

To enable user interaction, computing system 800 includes an input device 845, which can represent any number of input mechanisms, such as a microphone for speech, a touch-sensitive screen for gesture or graphical input, keyboard, mouse, motion input, speech, etc. Computing system 800 can also include output device 835, which can be one or more of a number of output mechanisms known to those of skill in the art. In some instances, multimodal systems can enable a user to provide multiple types of input/output to communicate with computing system 800. Computing system 800 can include communications interface 840, which can generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communication interface 840 may also include one or more Global Navigation Satellite System (GNSS) receivers or transceivers that are used to determine a location of the computing system 800 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 830 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L#), Resistive RAM (RRAM/ReRAM), Phase Change Memory (PCM), Spin Transfer Torque RAM (STT-RAM), another memory chip or cartridge, and/or a combination thereof.

Storage device 830 can include software services, servers, services, etc., that when the code that defines such software is executed by the processor 810, it causes the system 800 to perform a function. In some embodiments, a hardware service that performs a particular function can include the software component stored in a computer-readable medium in connection with the necessary hardware components, such as processor 810, connection 805, output device 835, etc., to carry out the function.

Embodiments within the scope of the disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Selected Examples

Example 1 includes a method synthetic loading of configurable logic devices, the method of Example 1 comprising: determining computational elements that are available for configuration in a configurable logic hardware device; executing a compilation process to program the available computational elements with a conditionally-enabled configuration and to program one or more load enable trees to enable a load of the conditionally-enabled configuration at the computational elements; configuring a software interface to enable the load of the conditionally-enabled configuration on portions of the computational elements via the one or more load enable trees based on a percentage enablement parameter; and enabling iteration through different percentage enablement parameter values, via the software interface, to cause the load of the conditionally-enabled configuration to be applied to different portions of the computational elements without recompiling the configurable logic hardware device.

In Example 2, the subject matter of Example 1 can optionally include wherein the configurable logic hardware device comprises a field-programmable gate array (FPGA). In Example 3, the subject matter of any one of Examples 1-2 can optionally include wherein an autonomous vehicle (AV) comprises the configurable logic hardware device. In Example 4, the subject matter of any one of Examples 1-3 can optionally include wherein the computational elements comprise at least one of a look-up table (LUT) computational element, a random access memory (RAM) computational element, or a multiply-accumulate (MAC) computational element.

In Example 5, the subject matter of any one of Examples 1-4 can optionally include wherein the conditionally-enabled configuration for the LUT computational element comprises a register that feeds back upon itself using an inverter to invert data of the register each cycle. In Example 6, the subject matter of any one of Examples 1-5 can optionally include wherein the conditionally-enabled configuration for the RAM computational element comprises a LUT computational element load that is input to an exclusive-or (XOR) gate to implement an XOR with data from the RAM computational element and written back into the RAM computational element.

In Example 7, the subject matter of any one of Examples 1-6 can optionally include wherein the conditionally-enabled configuration for the MAC computational element comprises a LUT computational element load that is input to an exclusive-or (XOR) gate to implement an XOR with data from the MAC computational element and written back into the MAC computational element, and wherein the MAC computational element performs a MAC operation. In Example 8, the subject matter of any one of Examples 1-7 can optionally include wherein the computational elements are grouped into subsets corresponding to the portions, wherein each portion is controllable by the load enable tree, and wherein a number of the subsets corresponds to the percentage enablement parameter.

In Example 9, the subject matter of any one of Examples 1-8 can optionally include wherein the configurable logic hardware device further comprises a control interface to enable the software interface to the configurable logic hardware device and one or more registers to store data for the configurable logic hardware device. In Example 10, the subject matter of any one of Examples 1-9 can optionally include wherein the load of the conditionally-enabled configuration and the percentage enablement parameters are to enable application of a stress test on the configurable logic hardware device.

Example 11 includes an apparatus for synthetic loading of configurable logic devices, the apparatus of Example 11 comprising logic hardware circuitry to: determine computational elements that are available for configuration in a configurable logic hardware device; execute a compilation process to program the available computational elements with a conditionally-enabled configuration and to program one or more load enable trees to enable a load of the conditionally-enabled configuration at the computational elements; configure a software interface to enable the load of the conditionally-enabled configuration on portions of the computational elements via the one or more load enable trees based on a percentage enablement parameter; and enable iteration through different percentage enablement parameter values, via the software interface, to cause the load of the conditionally-enabled configuration to be applied to different portions of the computational elements without recompiling the configurable logic hardware device.

In Example 12, the subject matter of Example 11 can optionally include wherein the configurable logic hardware device comprises a field-programmable gate array (FPGA). In Example 13, the subject matter of Examples 11-12 can optionally include wherein the computational elements comprise at least one of a look-up table (LUT) computational element, a random access memory (RAM) computational element, or a multiply-accumulate (MAC) computational element. In Example 14, the subject matter of Examples 11-13 can optionally include wherein the conditionally-enabled configuration for the LUT computational element comprises a register that feeds back upon itself using an inverter to invert data of the register each cycle.

In Example 15, the subject matter of Examples 11-14 can optionally include wherein the conditionally-enabled configuration for the RAM computational element comprises a LUT computational element load that is input to an exclusive-or (XOR) gate to implement an XOR with data from the RAM computational element and written back into the RAM computational element. In Example 16, the subject matter of Examples 11-15 can optionally include wherein the conditionally-enabled configuration for the MAC computational element comprises a LUT computational element load that is input to an exclusive-or (XOR) gate to implement an XOR with data from the MAC computational element and written back into the MAC computational element, and wherein the MAC computational element performs a MAC operation. In Example 17, the subject matter of Examples 11-16 can optionally include wherein the computational elements are grouped into subsets corresponding to the portions, wherein each portion is controllable by the load enable tree, and wherein a number of the subsets corresponds to the percentage enablement parameter.

Example 18 is a non-transitory computer-readable storage medium for facilitating synthetic loading of configurable logic devices. The non-transitory computer-readable storage medium of Example 17 having stored thereon executable computer program instructions that, when executed by one or more processors, cause the one or more processors to: determine computational elements that are available for configuration in a configurable logic hardware device; execute a compilation process to program the available computational elements with a conditionally-enabled configuration and to program one or more load enable trees to enable a load of the conditionally-enabled configuration at the computational elements; configure a software interface to enable the load of the conditionally-enabled configuration on portions of the computational elements via the one or more load enable trees based on a percentage enablement parameter; and enable iteration through different percentage enablement parameter values, via the software interface, to cause the load of the conditionally-enabled configuration to be applied to different portions of the computational elements without recompiling the configurable logic hardware device.

In Example 19, the subject matter of Example 18 can optionally include wherein the computational elements comprise at least one of a look-up table (LUT) computational element, a random access memory (RAM) computational element, or a multiply-accumulate (MAC) computational element. In Example 20, the subject matter of Examples 18-19 can optionally include wherein the computational elements are grouped into subsets corresponding to the portions, wherein each portion is controllable by the load enable tree, and wherein a number of the subsets corresponds to the percentage enablement parameter.

Example 21 is a system for facilitating synthetic loading of configurable logic devices. The system of Example 21 can optionally include a memory to store a block of data, and a logic hardware circuitry communicably coupled to the memory, wherein the logic hardware circuitry is to: determine computational elements that are available for configuration in a configurable logic hardware device; execute a compilation process to program the available computational elements with a conditionally-enabled configuration and to program one or more load enable trees to enable a load of the conditionally-enabled configuration at the computational elements; configure a software interface to enable the load of the conditionally-enabled configuration on portions of the computational elements via the one or more load enable trees based on a percentage enablement parameter; and enable iteration through different percentage enablement parameter values, via the software interface, to cause the load of the conditionally-enabled configuration to be applied to different portions of the computational elements without recompiling the configurable logic hardware device.

In Example 22, the subject matter of Example 21 can optionally include wherein the configurable logic hardware device comprises a field-programmable gate array (FPGA). In Example 23, the subject matter of Examples 21-22 can optionally include wherein the computational elements comprise at least one of a look-up table (LUT) computational element, a random access memory (RAM) computational element, or a multiply-accumulate (MAC) computational element. In Example 24, the subject matter of Examples 21-23 can optionally include wherein the conditionally-enabled configuration for the LUT computational element comprises a register that feeds back upon itself using an inverter to invert data of the register each cycle.

In Example 25, the subject matter of Examples 21-24 can optionally include wherein the conditionally-enabled configuration for the RAM computational element comprises a LUT computational element load that is input to an exclusive-or (XOR) gate to implement an XOR with data from the RAM computational element and written back into the RAM computational element. In Example 26, the subject matter of Examples 21-25 can optionally include wherein the conditionally-enabled configuration for the MAC computational element comprises a LUT computational element load that is input to an exclusive-or (XOR) gate to implement an XOR with data from the MAC computational element and written back into the MAC computational element, and wherein the MAC computational element performs a MAC operation. In Example 27, the subject matter of Examples 21-26 can optionally include wherein the computational elements are grouped into subsets corresponding to the portions, wherein each portion is controllable by the load enable tree, and wherein a number of the subsets corresponds to the percentage enablement parameter.

Example 28 includes an apparatus comprising means for performing the method of any of the Examples 1-10. Example 29 is at least one machine readable medium comprising a plurality of instructions that in response to being executed on a computing device, cause the computing device to carry out a method according to any one of Examples 1-10. Example 30 is an apparatus for facilitating synthetic loading of configurable logic devices, configured to perform the method of any one of Examples 1-10. Specifics in the Examples may be used anywhere in one or more embodiments.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. A method comprising:
    determining computational elements that are available for configuration in a configurable logic hardware device;
    executing a compilation process to program the available computational elements with a conditionally-enabled configuration and to program one or more load enable trees to enable a load of the conditionally-enabled configuration at the computational elements;
    configuring a software interface to enable the load of the conditionally-enabled configuration on portions of the computational elements via the one or more load enable trees based on a percentage enablement parameter; and
    enabling iteration through different percentage enablement parameter values, via the software interface, to cause the load of the conditionally-enabled configuration to be applied to different portions of the computational elements without recompiling the configurable logic hardware device.

2. The method of claim 1, wherein the configurable logic hardware device comprises a field-programmable gate array (FPGA).

3. The method of claim 1, wherein an autonomous vehicle (AV) comprises the configurable logic hardware device.

4. The method of claim 1, wherein the computational elements comprise at least one of a look-up table (LUT) computational element, a random access memory (RAM) computational element, or a multiply-accumulate (MAC) computational element.

5. The method of claim 4, wherein the conditionally-enabled configuration for the LUT computational element comprises a register that feeds back upon itself using an inverter to invert data of the register each cycle.

6. The method of claim 4, wherein the conditionally-enabled configuration for the RAM computational element comprises a LUT computational element load that is input to an exclusive-or (XOR) gate to implement an XOR with data from the RAM computational element and written back into the RAM computational element.

7. The method of claim 4, wherein the conditionally-enabled configuration for the MAC computational element comprises a LUT computational element load that is input to an exclusive-or (XOR) gate to implement an XOR with data from the MAC computational element and written back into the MAC computational element, and wherein the MAC computational element performs a MAC operation.

8. The method of claim 1, wherein the computational elements are grouped into subsets corresponding to the portions, wherein each portion is controllable by the load enable tree, and wherein a number of the subsets corresponds to the percentage enablement parameter.

9. The method of claim 1, wherein the configurable logic hardware device further comprises a control interface to enable the software interface to the configurable logic hardware device and one or more registers to store data for the configurable logic hardware device.

10. The method of claim 1, wherein the load of the conditionally-enabled configuration and the percentage enablement parameters are to enable application of a stress test on the configurable logic hardware device.

11. An apparatus comprising:
    logic hardware circuitry to:
        determine computational elements that are available for configuration in a configurable logic hardware device;
        execute a compilation process to program the available computational elements with a conditionally-enabled configuration and to program one or more load enable trees to enable a load of the conditionally-enabled configuration at the computational elements;
        configure a software interface to enable the load of the conditionally-enabled configuration on portions of the computational elements via the one or more load enable trees based on a percentage enablement parameter; and
        enable iteration through different percentage enablement parameter values, via the software interface, to cause the load of the conditionally-enabled configuration to be applied to different portions of the computational elements without recompiling the configurable logic hardware device.

12. The apparatus of claim 11, wherein the configurable logic hardware device comprises a field-programmable gate array (FPGA).

13. The apparatus of claim 11, wherein the computational elements comprise at least one of a look-up table (LUT) computational element, a random access memory (RAM) computational element, or a multiply-accumulate (MAC) computational element.

14. The apparatus of claim 13, wherein the conditionally-enabled configuration for the LUT computational element comprises a register that feeds back upon itself using an inverter to invert data of the register each cycle.

15. The apparatus of claim 13, wherein the conditionally-enabled configuration for the RAM computational element comprises a LUT computational element load that is input to an exclusive-or (XOR) gate to implement an XOR with data from the RAM computational element and written back into the RAM computational element.

16. The apparatus of claim 13, wherein the conditionally-enabled configuration for the MAC computational element comprises a LUT computational element load that is input to an exclusive-or (XOR) gate to implement an XOR with data from the MAC computational element and written back into the MAC computational element, and wherein the MAC computational element performs a MAC operation.

17. The apparatus of claim 11, wherein the computational elements are grouped into subsets corresponding to the portions, wherein each portion is controllable by the load enable tree, and wherein a number of the subsets corresponds to the percentage enablement parameter.

18. A non-transitory computer-readable medium having stored thereon instructions that, when executed by one or more processors, cause the one or more processors to:
- determine computational elements that are available for configuration in a configurable logic hardware device;
- execute a compilation process to program the available computational elements with a conditionally-enabled configuration and to program one or more load enable trees to enable a load of the conditionally-enabled configuration at the computational elements;
- configure a software interface to enable the load of the conditionally-enabled configuration on portions of the computational elements via the one or more load enable trees based on a percentage enablement parameter; and
- enable iteration through different percentage enablement parameter values, via the software interface, to cause the load of the conditionally-enabled configuration to be applied to different portions of the computational elements without recompiling the configurable logic hardware device.

19. The non-transitory computer-readable medium of claim 18, wherein the computational elements comprise at least one of a look-up table (LUT) computational element, a random access memory (RAM) computational element, or a multiply-accumulate (MAC) computational element.

20. The non-transitory computer-readable medium of claim 18, wherein the computational elements are grouped into subsets corresponding to the portions, wherein each portion is controllable by the load enable tree, and wherein a number of the subsets corresponds to the percentage enablement parameter.

* * * * *